(12) United States Patent
Ohkuni (10) Patent No.: US 6,355,183 B1
(45) Date of Patent: Mar. 12, 2002

(54) APPARATUS AND METHOD FOR PLASMA ETCHING

(75) Inventor: Mitsuhiro Ohkuni, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/383,417

(22) Filed: Aug. 26, 1999

(30) Foreign Application Priority Data

Sep. 4, 1998 (JP) .......................... 10-250915

(51) Int. Cl.⁷ ............................... B44C 1/22
(52) U.S. Cl. ...................... 216/67; 216/68; 438/725
(58) Field of Search ............ 216/67, 68; 438/725; 156/345; 118/723 R, 723 MW (56) References Cited

U.S. PATENT DOCUMENTS

| | | |
|---|---|---|
| 4,948,458 A | 8/1990 | Ogle |
| 5,614,055 A | 3/1997 | Fairbairn et al. |
| 6,028,285 A * | 2/2000 | Khater et al. ........... 219/121.43 |
| 6,035,868 A * | 3/2000 | Kennedy et al. ........... 134/1.1 |
| 6,093,457 A * | 7/2000 | Okumura et al. ........... 427/569 |
| 6,214,161 B1 * | 4/2001 | Becker et al. ........... 156/345 |

FOREIGN PATENT DOCUMENTS

| | | |
|---|---|---|
| JP | 9-178000 | 7/1997 |
| JP | 9-210222 | 8/1997 |

* cited by examiner

*Primary Examiner*—Randy Gulakowski
*Assistant Examiner*—Shamim Ahmed
(74) *Attorney, Agent, or Firm*—Eric J. Robinson; Nixon Peabody LLP (57) ABSTRACT

In a chamber, there are provided a sample stage on which a semiconductor substrate is placed, a gas inlet port for introducing etching gas, and a gas outlet port for exhausting the gas. A slide valve having a valve element which rotates relative to a valve seat is provided between the sample stage and the gas outlet port to adjust the amount of gas exhausted from the gas outlet port with the rotation of the valve element. A spiral coil for generating a high-frequency induction field and thereby changing the etching gas into a plasma is rotatably provided over the chamber. Rotative driving means rotates the spiral coil in response to the rotation of the valve element of the slide valve such that the higher-voltage region of the spiral coil approximately coincides with the exhaust-side region of the slide valve.

2 Claims, 10 Drawing Sheets

LOWER-VOLTAGE REGION | HIGHER-VOLTAGE REGION

PRIOR ART

Fig. 9(a)

OPENING RATE OF VALVE 0%

Fig. 9(b)

OPENING RATE OF VALVE 15%

Fig. 9(c)

OPENING RATE OF VALVE 25%

Fig. 9(d)

OPENING RATE OF VALVE 40%

APPARATUS AND METHOD FOR PLASMA ETCHING

BACKGROUND OF THE INVENTION

The present invention relates to an apparatus and method for plasma etching. More particularly, it relates to an apparatus and method for plasma etching wherein a target film is etched by a plasma generated with a high-frequency induction field produced by a spiral coil.

With the increasing miniaturization of a semiconductor integrated circuit element in recent years, exposing light with a shorter wavelength has been used in a lithographic step. At present, a KrF excimer laser (with a wavelength of 248 nm) or an ArF excimer laser (with a wavelength of 193 nm) is used.

As the wavelength of exposing light becomes shorter, the reflectivity of light reflected from a substrate after exposing a resist film becomes higher so that the reflected light from the substrate is more likely to cause variations in the size of a resist pattern.

To prevent the reflected light from being incident on the resist film, there has recently been used a process wherein an organic bottom anti-reflective coating (hereinafter referred to as ARC) is formed under the resist film. The ARC process is a technique used primarily in the process of manufacturing a semiconductor element in a high-performance device with design rules whereby a gate width is 0.25 μm or less.

In the ARC process, it is necessary to etch the ARC after a resist pattern is formed by a conventional lithographic technique. Of a variety of plasma etching apparatus used to etch the ARC, an inductively coupled plasma (ICP) etching apparatus having a spiral coil is used frequently.

As examples of the inductively coupled plasma etching apparatus having a spiral coil, an inductively coupled plasma etching apparatus having a planar coil (see U.S. Pat. No.4,948,458), an inductively coupled plasma etching apparatus having a domed coil (see U.S. Pat. No. 5,614,055), and the like are known.

Figure 5A:
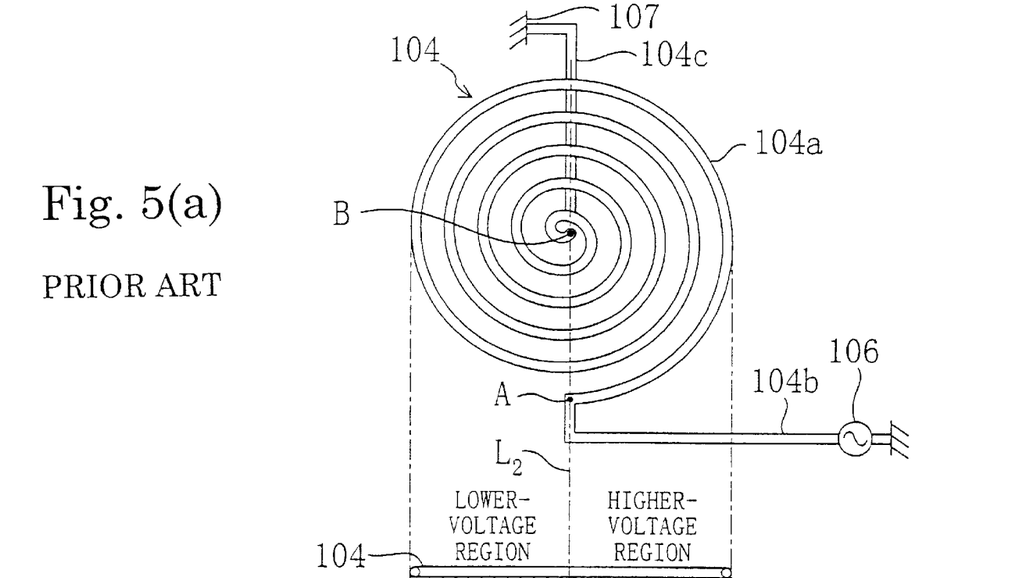
Figure 5B:
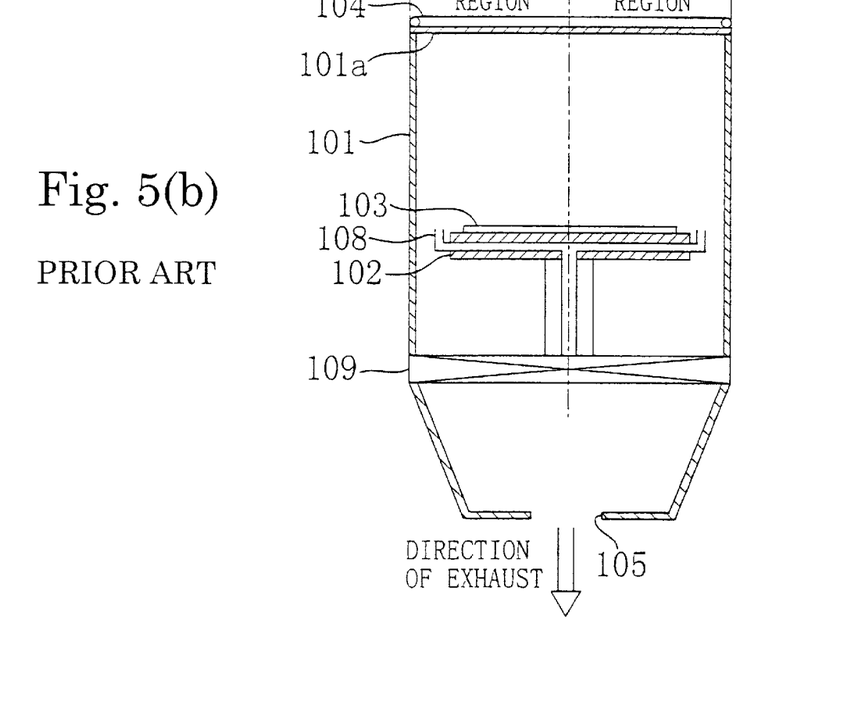

Referring to FIGS. 5(a) and 5(b), a conventional inductively coupled plasma etching apparatus having a planar single spiral coil will be described.

As shown in FIGS. 5(a) and 5(b), a sample stage 102 as a lower electrode to which high-frequency power is applied is disposed in the lower portion of a grounded chamber 101 having an inner wall covered with an insulator such as ceramic, alumina, or quartz. A semiconductor substrate 103 as a sample to be etched is placed on the sample stage 102. A gas inlet port 108 for introducing etching gas into the chamber 101 via a mass flow controller is provided around the sample stage 102, while a gas outlet port 105 connected to a turbo pump for adjusting pressure in the chamber 1 to the order of 0.1 to 10 Pa is provided in the bottom portion of the chamber 101.

A slide valve 109 having a valve seat and a valve element which rotates relative to the valve seat is provided between the sample stage 102 and the gas outlet port 105 to adjust the amount of gas exhausted from the gas outlet port 105 with the rotation of the valve element. As the slide valve 109, there can be used, e.g., a known slide valve commercially available from VAT Holding AG, Switzerland under the trade name of VAT: Series65 (see Japanese Unexamined Patent Publication Nos. 9-178000 and 9-210222).

An inductively-coupled single spiral coil 104 is provided over a quartz plate 101a as the ceiling of the chamber 101, i.e., over the chamber 101 in opposing relation to the sample stage 102. A coil portion 104a of the single spiral coil 104 has an outermost end A connected to a high-frequency power supply source 106 via a power-supply-side withdrawn portion 104b including a matching circuit (not shown) and an innermost end B connected to a ground source 107 composed of a wall portion of the chamber 101 via a ground-side withdrawn portion 104c.

When high-frequency power is supplied from the high-frequency power-supply source 106 to the single spiral coil 104, a high-frequency induction field is generated around the single spiral coil 104, which changes the etching gas introduced into the chamber 101 into a plasma. The etching gas that has been changed into the plasma is guided by the high-frequency power applied to the sample stage 102 to a target film on the semiconductor substrate 103 held by the sample stage 102, thereby etching the target film.

By using the conventional inductively-coupled plasma etching apparatus and etching gas composed of a mixture of $N_2$ gas and $O_2$ gas, the present inventors performed an etching process with respect to the ARC as the target film, while holding the pressure in the chamber 101 constant and varying the total flow rate of the gas (the sum of the flow rates of $N_2$ gas and $O_2$ gas, i.e., varying the amount of introduced gas and the opening rate of the slide valve 109. The etching conditions are as shown in Tables 1 and 2. As shown in Tables 1 and 2, etching was performed by varying the amount of introduced gas ($N_2/O_2$) and the opening rate of the slide valve.

TABLE 1

| | |
|---|---|
| $N_2/O_2$ | 30/30 (sccm) |
| ICP/RF | 350/50 (W) |
| PRESSURE | 8 (mTorr) |
| TEMPERATURE OF SAMPLE STAGE | 10 (° C.) |
| OPENING RATE OF SLIDE VALVE | 15 (%) |

TABLE 2

| | |
|---|---|
| $N_2/O_2$ | 120/120 (sccm) |
| ICP/RF | 350/50 (W) |
| PRESSURE | 8 (mTorr) |
| TEMPERATURE OF SAMPLE STAGE | 10 (° C.) |
| OPENING RATE OF SLIDE VALVE | 40 (%) |

Figure 6:
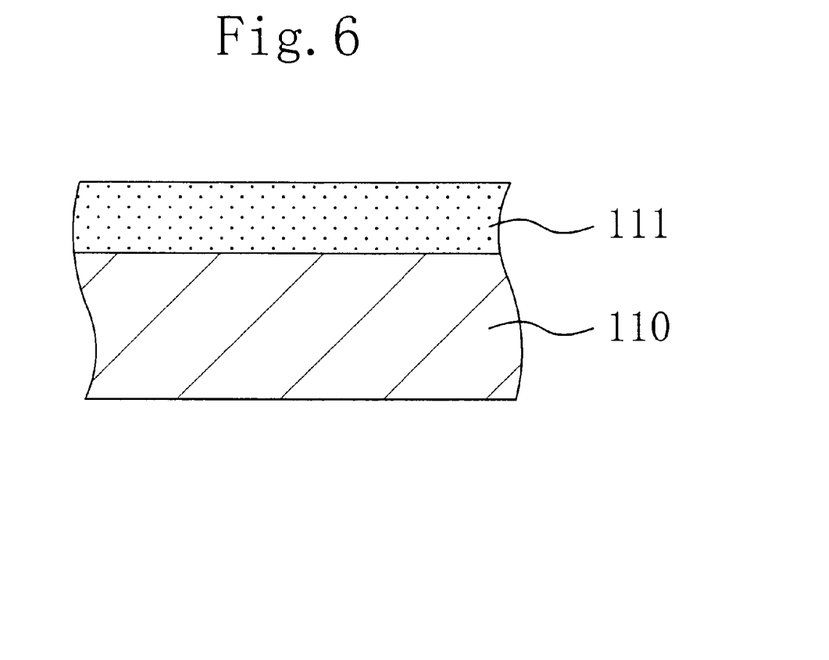
FIG. 6 is a cross-sectional view for illustrating a target film to be etched in accordance with the plasma etching method of the present invention and the conventional plasma etching method.

In Tables 1 and 2, ICP represents high-frequency power applied to the single spiral coil 104 and RF represents high-frequency power applied to the sample stage 102. The target film is the ARC 111 formed on the semiconductor substrate 110, as shown in FIG. 6.

Figure 7:
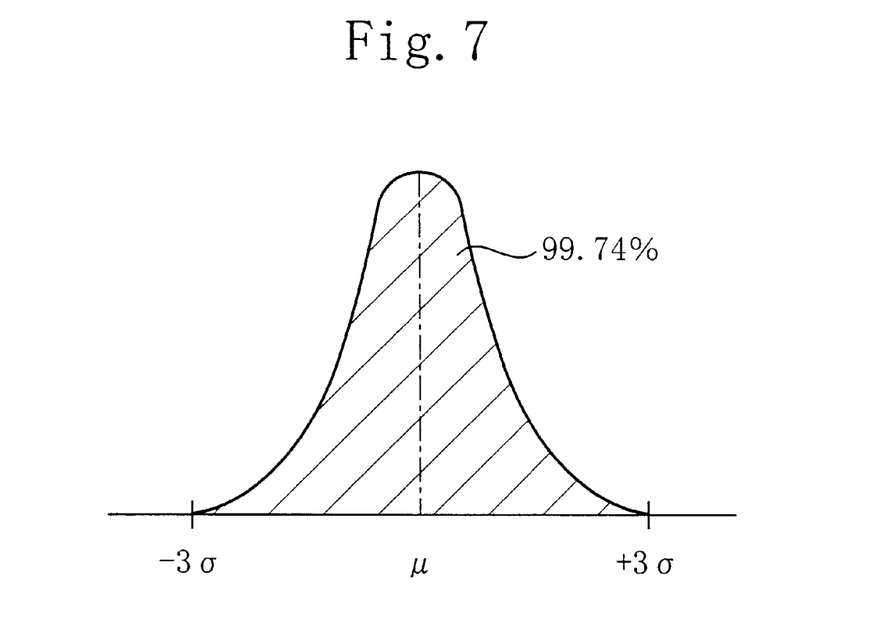
FIG. 7 is a view for illustrating the definition of the inplane uniformity of an etching rate in the case of performing etching in accordance with the plasma etching method of the present invention and the conventional plasma etching method.

As a result of performing etching under the foregoing conditions, the present inventors have found that the inplane uniformity of the etching rate is degraded if the flow rate of the etching gas is increased. The inplane uniformity of the etching rate is defined as the extent of variation of the etching rate across the surface of the target film and expressed as $3\sigma/\mu \times 100$ (%), where $\sigma$ is the standard deviation of a data value and $\mu$ is the mean value of the data value. When variations in data value exhibit a normal distribution, $3\sigma$ represents a deviation including 99.74% of the data value, as shown in FIG. 7. The following equation 1 shows 3 σ and μ specifically.

$$3\sigma = 3\sqrt{\frac{\sum_{i=1}^{n}(Xi-\mu)^2}{n}}$$

Equation 1 where

μ: mean value=

$$\frac{\sum_{i=1}^{n} Xi}{n}$$

n: number of samples

Xi: i-th data value.

Figure 8:
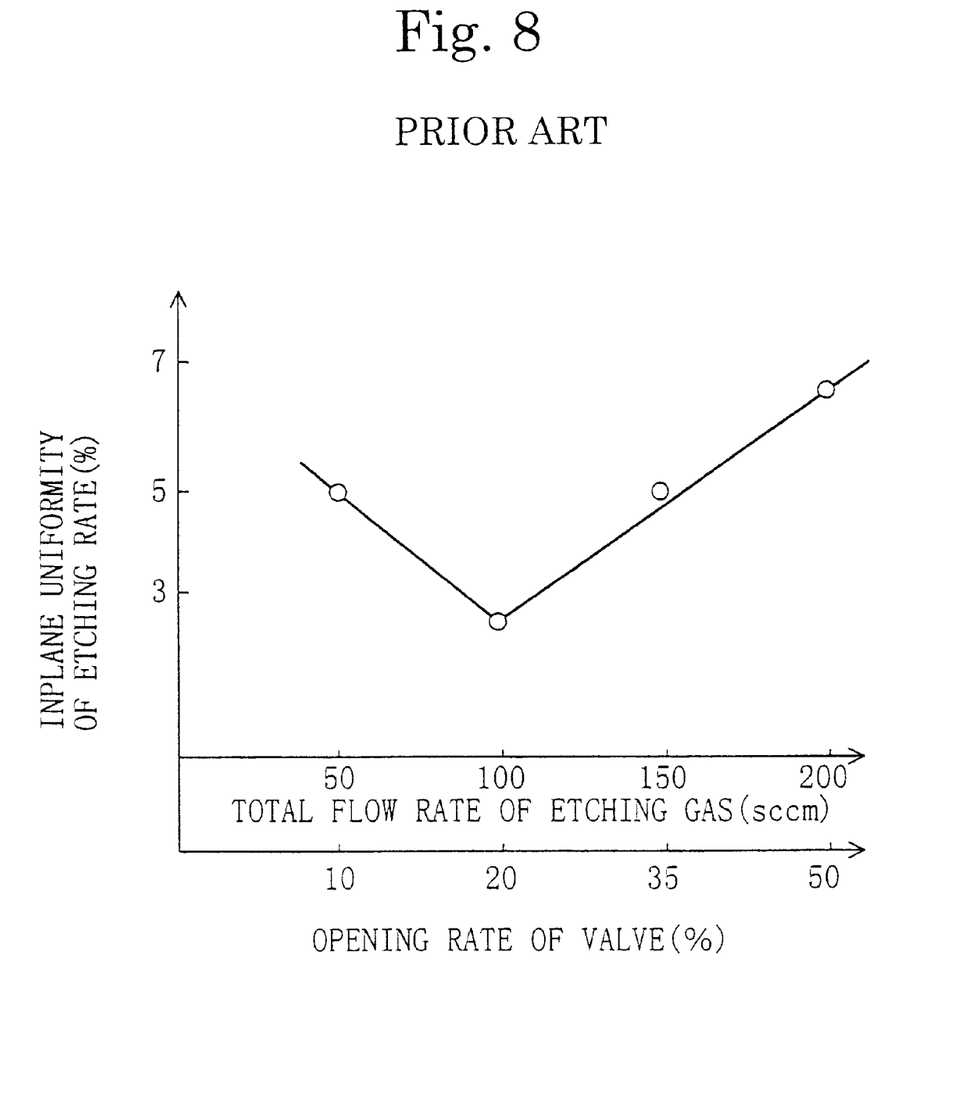
FIG. 8 is a view showing the relationships between the inplane uniformity of an etching rate and the total flow rate of etching gas and the opening rate of a valve in the case of performing etching with respect to an ARC in accordance with the conventional plasma etching method.

FIG. 8 is a view showing the relationship between the inplane uniformity of the etching rate and the total flow rate of the gas. In FIG. 8, the horizontal axes represent the total flow rate (sccm) of the etching gas and the opening rate (%) of the slide valve and the vertical axis represents the inplane uniformity (%) of the etching rate.

As will be understood from FIG. 8, the inplane uniformity of the etching rate changes when the total flow rate of the etching gas changes and the opening rate of the slide valve changes. Specifically, the inplane uniformity is improved temporarily (variation of the etching rate is reduced) if the opening rate changes from 10% to 20% but the inplane uniformity is degraded again (variation of the etching rate is increased) if the opening rate exceeds 20%.

The degraded inplane uniformity of the etching rate causes variations in the actual amount of etching across the surface of the target film. If the actual amount of etching varies across the surface of the target film, adverse effects are produced such as variations in the characteristics of a FET in the case of forming the gate electrode of the FET by etching.

SUMMARY OF THE INVENTION

In view of the foregoing, it is therefore an object of the present invention to prevent the inplane uniformity of the etching rate from changing even if the total flow rate of the etching gas and the opening rate of the slide valve change.

The present inventors have made a through examination on the cause of a change in the inplane uniformity of the etching rate which occurs when the total flow rate of the etching gas and the opening rate of the slide valve change and achieved the following findings.

Under the condition that the pressure in the chamber is held constant, a change in the total flow rate of the etching gas is caused by a change in the opening rate of the slide valve. Therefore, the present inventors have considered that the inplane uniformity of the etching rate changes in response to the change in the opening rate of the slide valve 109 and examined the relationship between the change in the opening rate of the slide valve 109 and the inplane uniformity of the etching rate.

FIGS. 9(a) to 9(d) show changes in the opening rate of the slide valve 109 composed of a plate-like valve element 109a which rotates relative to a ring-shaped valve seat 109b around a rotation axis 109c and changes in the angle of rotation of the valve element 109a relative to the valve seat 109b. As the opening rate of the slide valve 109 increases, a linearly symmetric line $L_0$ which divides the opening 109d of the slide valve 109 linearly symmetrically is tilted such that the righthand end thereof moves upward, while a first line $L_1$ passing through the center C (center of the opening when the slide valve is fully opened) of the valve seat 109b and perpendicular to the linearly symmetric line $L_0$ is tilted such that the upper end thereof moves leftward. In other words, the angle of tilt of the linearly symmetric line $L_0$ from a first reference line $L_X$ extending horizontally in FIG. 9(a) (i.e., the angle of tilt of the first line $L_1$ from a second reference line $L_Y$ extending vertically) is increased.

Figure 10:
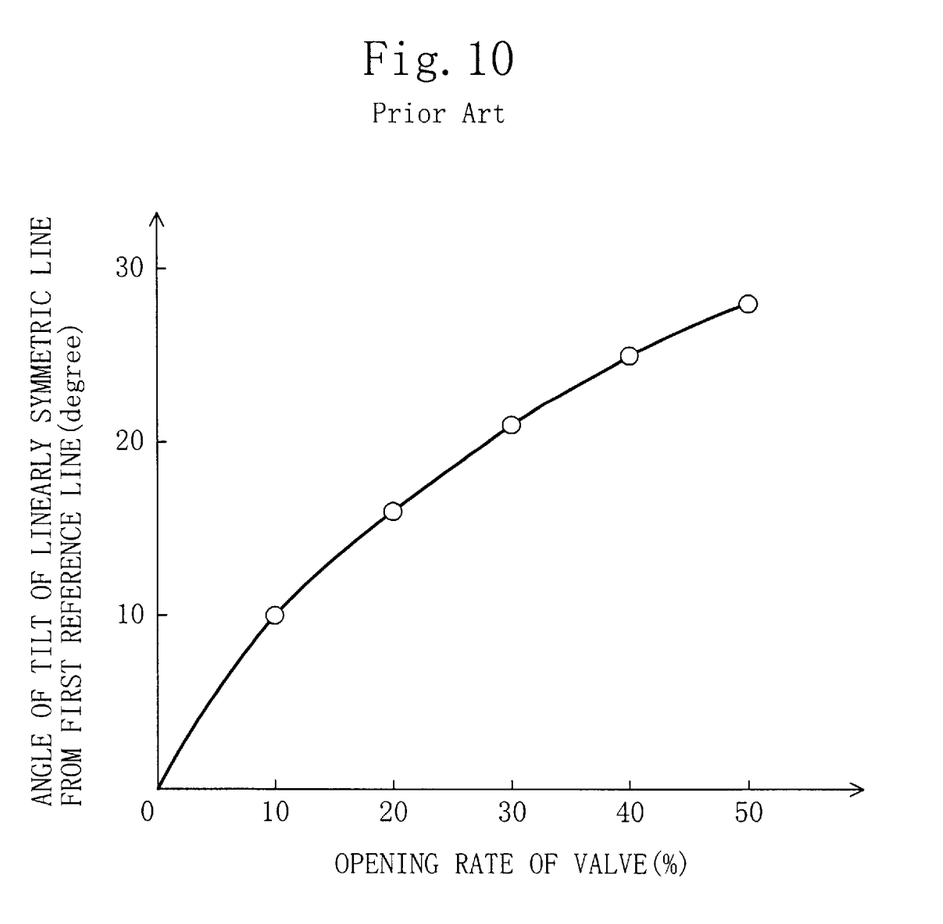
FIG. 10 is a view for illustrating the relationship between the opening rate of the slide valve and an angle of tilt of a linearly symmetric line from a first reference line in the conventional plasma etching apparatus.

FIG. 10 shows the relationship between the opening rate (%) of the slide valve 109 and the angle of tilt of the linearly symmetric line $L_0$ from the first reference line $L_X$ (angle of tilt of the first line $L_1$ from the second reference line $L_Y$).

Hereinafter, of the two regions of the slide valve 109 separated by the first line $L_1$ in FIGS. 9(a) to 9(d), the region (righthand region) containing the opening 109d will be defined as an exhaust-side region and the region (lefthand region) which does not substantially contain the opening 109d will be defined as a counter-exhaust-side region.

In FIGS. 5(a) and 5(b), it is assumed that the coil portion 104a of the single spiral coil 104 is divided into two regions by a second line $L_2$ connecting the outermost end A of the coil portion 104a (connecting portion between the coil portion 104a and the power-supply-side withdrawn portion 104b) to the innermost end B of the coil portion 104a. Of the two regions of the coil portion 104a separated by the second line $L_2$, the region containing a portion connected directly to the outermost end A is defined as a higher-voltage region (where a high-frequency voltage is relatively high) and the region not containing the portion connected directly to the outermost end A is defined as a lower-voltage region (where the high-frequency voltage is relative low).

Figure 11A:
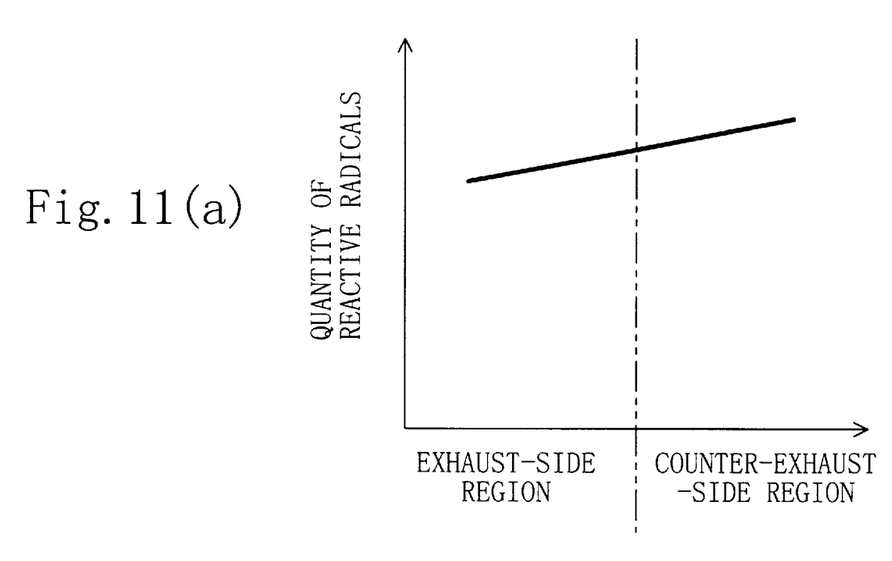
Figure 11B:
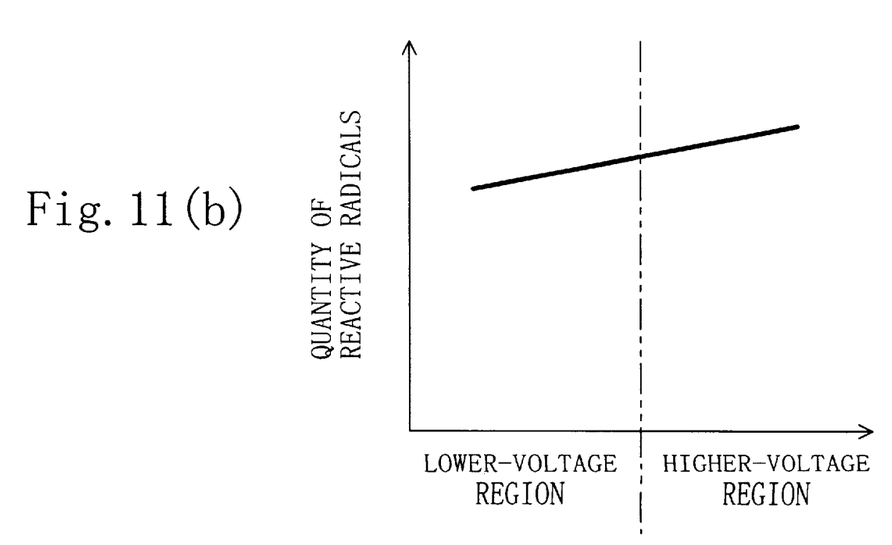

From FIG. 11(a), it will be understood that the area of the plasma generation region of the chamber 101 corresponding to the counter-exhaust-side region of the slide valve 109 is larger in the quantity of reactive radicals distributed thereover than in the area corresponding to the exhaust-side region of the slide valve 109. From FIG. 11(b), it will also be understood that the area of the plasma generation region of the chamber 101 corresponding to the higher-voltage region of the single spiral coil 104 is larger in the quantity of reactive radicals distributed thereover than in the area corresponding to the lower-voltage region of the single spiral coil 104 because of a high plasma density.

Figure 12A:
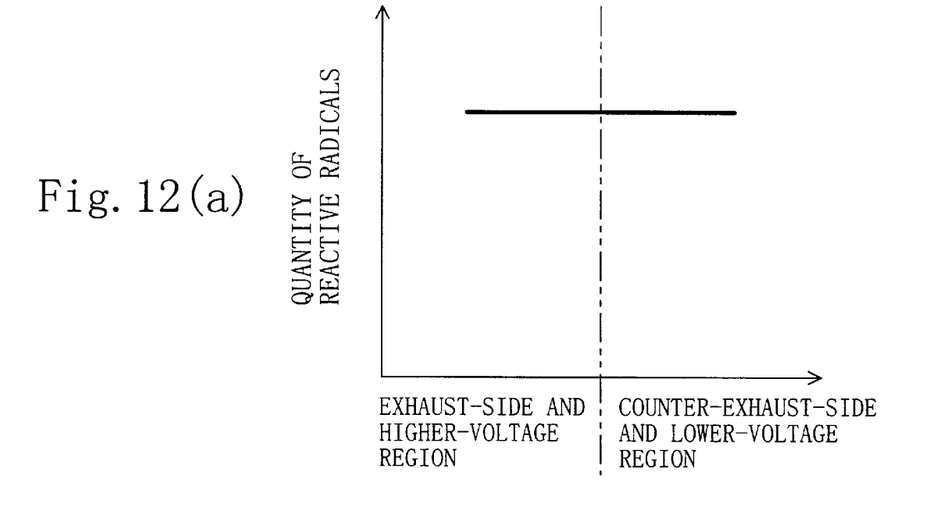
Figure 12B:
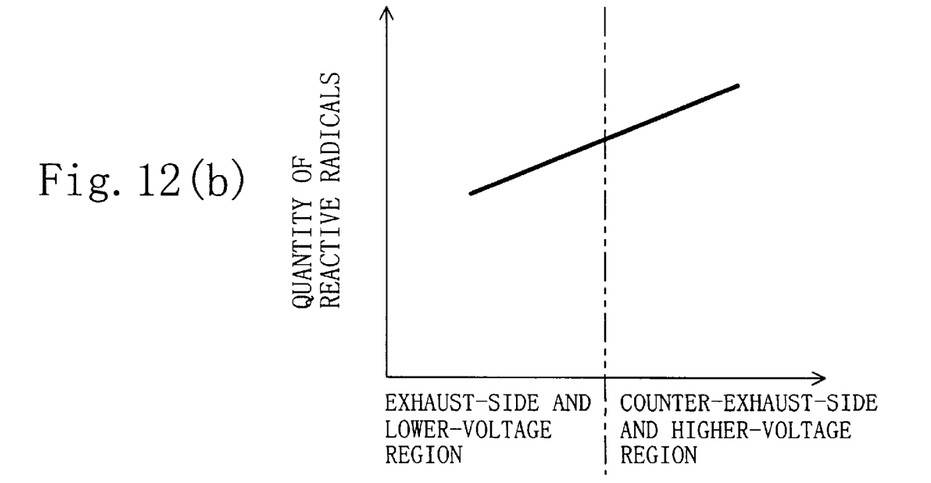

Therefore, if the exhaust-side region of the slide valve 109 coincides with the higher-voltage region of the single spiral coil 104 and the counter-exhaust-side region of the slide valve 109 coincides with the lower-voltage region of the single spiral coil 104, as shown in FIG. 12(a), the quantity of reactive radicals distributed over the plasma generation region of the chamber 101 becomes uniform. On the other hand, if the exhaust-side region of the slide valve 109 coincides with the lower-voltage region of the single spiral coil 104 and the counter-exhaust-side region of the slide valve 109 coincides with the higher-voltage region of the single spiral coil 104, as shown in FIG. 12(b), the quantity of reactive radicals distributed over the plasma generation region becomes non-uniform, so that the quantity of reactive radicals distributed over the former region is smaller than that distributed over the latter region.

The present invention, which has been achieved based on the foregoing findings, provides a uniform quantity of reactive radicals distributed over the plasma generation region of the chamber by causing the higher-voltage region of the spiral coil to most approximately coincide with the exhaust-side region of the slide valve and causing the lower-voltage region of the spiral coil to most approximately coincide with the counter-exhaust-side region of the slide valve.

Specifically, an apparatus for plasma etching according to the present invention comprises: a chamber; a gas inlet port provided in the chamber to introduce etching gas into the chamber; a sample stage provided within the chamber; a spiral coil disposed externally of the chamber in opposing relation to the sample stage, the spiral coil generating a high-frequency induction field and thereby changing the etching gas into a plasma; a gas outlet port provided in a bottom portion of the chamber to exhaust gas from the chamber; a slide valve having a valve element rotating relative to a valve seat and adjusting an amount of gas exhausted from the gas outlet port with the rotation of the valve element; coil holding means for rotatably holding the spiral coil; and rotative driving means for rotating the spiral coil in response to the rotation of the valve element of the slide valve such that a higher-voltage region of the spiral coil approximately coincides with an exhaust-side region of the slide valve.

In the apparatus for plasma etching of the present invention, when the valve element of the slide valve is rotated to change the opening rate of the slide valve, the exhaust-side region of the slide valve shifts but, if the spiral coil is rotated in response to the rotation of the valve element of the slide valve such that the higher-voltage region of the spiral coil approximately coincides with the exhaust-side region of the slide valve, the lower-voltage region of the single spiral coil coincides with the counter-exhaust-side region of the slide valve, so that the quantity of reactive radicals distributed over the plasma generation region of the chamber becomes uniform and therefore the etching rate over the surface of the target film becomes uniform.

A method for plasma etching according to the present invention comprises: a plasma generating step of changing etching gas introduced into a chamber into a plasma with a high-frequency induction field generated by a spiral coil rotatably disposed in opposing relation to a sample stage within the chamber; an etching step of guiding the etching gas that has been changed into the plasma toward a target film to be etched on a substrate held by the sample stage to etch the target film; and a gas exhaust step of exhausting the gas from the chamber through a bottom portion of the chamber, while adjusting an amount of exhaust by rotating a valve element of a slide valve relative to a valve seat, the etching step including the step of rotating the spiral coil in response to the rotation of the valve element of the slide valve such that a higher-voltage region of the spiral coil approximately coincides with an exhaust-side region of the slide valve.

In accordance with the plasma etching method of the present invention, if the valve element of the slide valve is rotated to change the opening rate of the slide valve, the spiral coil is rotated in response to the rotation of the slide valve such that the higher-voltage region of the spiral coil approximately coincides with the exhaust-side region of the slide valve. Consequently, the higher-voltage region of the spiral coil approximately coincides with the exhaust-side region of the slide valve, while the lower-voltage region of the spiral coil approximately coincides with the counter-exhaust-side region of the slide valve. As a result, the quantity of reactive radicals distributed over the plasma generation region of the chamber becomes uniform and therefore the etching rate over the surface of the target film becomes uniform.

Thus, in accordance with the apparatus and method for plasma etching according to the present invention, the etching rate over the surface of the target film becomes uniform so that adverse effects such as variations in the electric characteristics of a semiconductor element of a FET are prevented.

BRIEF DESCRIPTION OF THE DRAWINGS

FIG. 1($a$) is a plan view of a single spiral coil in an apparatus for plasma etching according to an embodiment of the present invention and FIG. 1($b$) is a cross-sectional view of the plasma etching apparatus;

FIGS. 2($a$) and 2($b$) are views for illustrating the exhaust-side region and counter-exhaust-side region of a slide valve in an apparatus and method for plasma etching according to the embodiment;

FIG. 5($a$) is a plan view of a single spiral coil in a conventional apparatus for plasma etching and FIG. 5($b$) is a cross-sectional view of the conventional plasma etching apparatus;

FIGS. 9($a$) to 9($d$) are views for illustrating the relationship between a change in the opening rate of a slide valve and an angle at which a valve element rotates relative to a valve seat in the conventional plasma etching apparatus;

FIG. 11($a$) is a view for illustrating the distribution of reactive radicals in the exhaust-side region and counter-exhaust-side region of the slide valve in the plasma etching apparatus according to the embodiment and FIG. 11($b$) is a view for illustrating the distribution of reactive radicals in the higher-voltage region and lower-voltage region of the spiral coil in the plasma etching apparatus according to the embodiment; and FIG. 12($a$) is a view for illustrating the distributions of reactive radicals over the exhaust-side and higher-voltage region and over the counter-exhaust-side and lower-voltage region in the plasma etching apparatus according to the embodiment and FIG. 12($b$) is a view for illustrating the distributions of reactive radicals over the exhaust-side and lower-voltage region and over the counter-exhaust-side and higher-voltage region in the plasma etching apparatus according to the embodiment.

DETAILED DESCRIPTION OF THE INVENTION

An apparatus and method for plasma etching according to an embodiment of the present invention will be described with reference to FIGS. 1(a) and 1(b), FIGS. 2(a) and 2(b), and FIGS. 3 and 4.

Figure 1A:
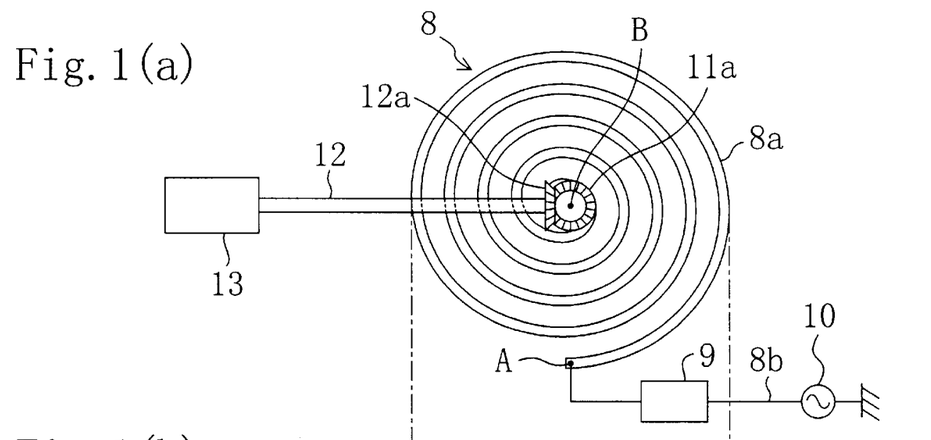
Figure 1B:
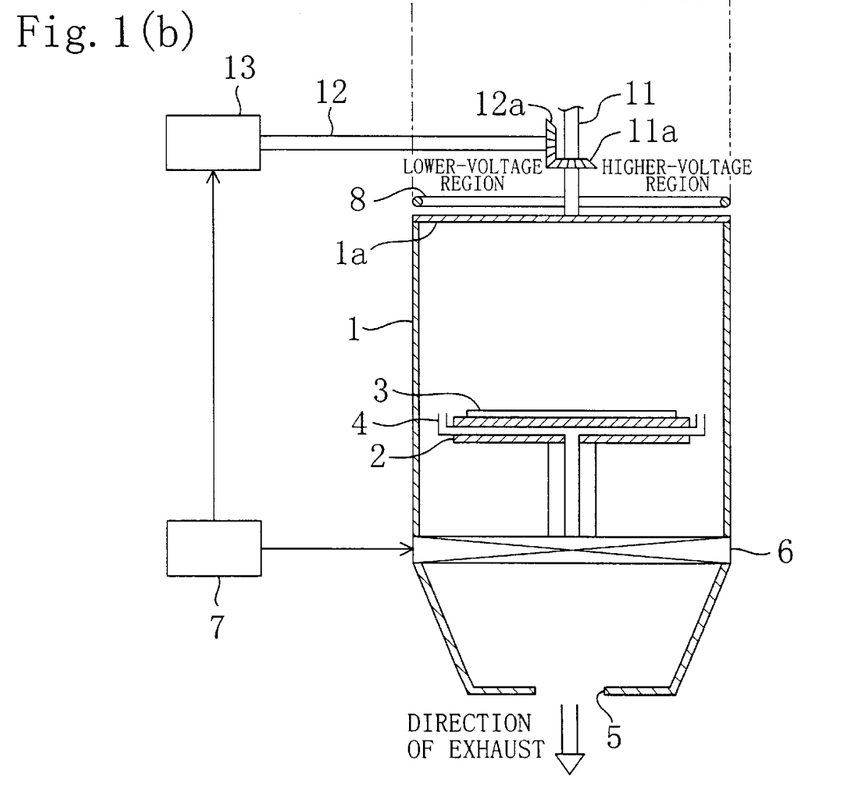

FIG. 1(a) shows a plan structure of a spiral coil in an inductively coupled plasma etching apparatus according to the embodiment and FIG. 1(b) shows a cross-sectional structure of the inductively coupled plasma etching apparatus.

A chamber 1 is configured as a cylinder having an outer diameter of, e.g., 400 mm and a height of, e.g., 300 mm. The chamber 1 has an inner wall covered with an insulator such as ceramic, alumina, or quartz. A sample stage 2 as a lower electrode to which high-frequency power is applied is disposed within the chamber 1. A semiconductor substrate 3 as a sample to be etched is placed on the sample stage 2.

A gas inlet port 4 for introducing etching gas into the chamber 1 via a mass flow controller is provided around the sample stage 2 in the chamber 1, while a gas outlet port 5 connected to a turbo pump (not shown) for adjusting the pressure in the chamber 1 to the order or 0.1 to 10 Pa is provided in the bottom portion of the chamber 1. A slide valve 6 composed of a plate-like valve element which rotates relative to a ring-shaped valve seat is provided between the sample stage 2 and the gas outlet port 5 in the chamber 1. The rotation angle of the valve element of the slide valve 6 and the opening rate of the slide valve 6 are controlled by a valve controller 7.

An inductively coupled single coil 8 is disposed on a quartz plate 1a as the ceiling of the chamber 1 in opposing relationship to the sample stage 2. A power-supply connection point A, which is the outermost end of a coil portion 8a of the single spiral coil 8, is connected to a high-frequency power supply source 10 via a power-supply-side withdrawn portion 8b containing a matching circuit 9. A ground connection point B, which is the innermost end of the coil portion 8a of the single spiral coil 8, is connected to a rotation shaft 11 disposed rotatably and having a first bevel gear 11a, which renders the coil portion 8a of the single spiral coil 8 rotatable. The first bevel gear 11a of the rotation shaft 11 is engaged with a second bevel gear 12a provided on a drive shaft 12. If the drive shaft 12 is rotated by a specified amount by rotative driving means 13 such as a motor, the rotation shaft 11 and the coil portion 8a of the spiral coil 8 rotates by a specified angle. It is to be noted that the ground connection point B of the coil portion 8a of the single spiral coil 8 is connected sequentially to the rotation shaft 11, the driving shaft 12, and the rotative driving means 13 and thereby connected to the ground.

When high-frequency power is supplied from the high-frequency power supply source 10 to the spiral coil 8, a high-frequency induced field is generated around the single spiral coil 8 and the etching gas introduced into the chamber 1 is changed into a plasma by the generated high-frequency induced field. The etching gas that has been changed into the plasma is guided by the high-frequency power applied to the sample stage 2 to the target film on the semiconductor substrate 3 held by the sample stage 2, thereby etching the target film.

A valve opening rate signal outputted from the valve controller 7 for controlling the opening rate of the slide valve 6 is outputted to the rotative driving means 13 and the rotative driving means 13 rotates the coil portion 8a of the spiral coil 8 by a specified angle based on the valve opening rate signal. A description will be given to a control method whereby the rotative driving means 13 rotates the coil portion 8a of the spiral coil 8 by the specified angle based on the valve opening rate signal.

Figures 2A, 2B:
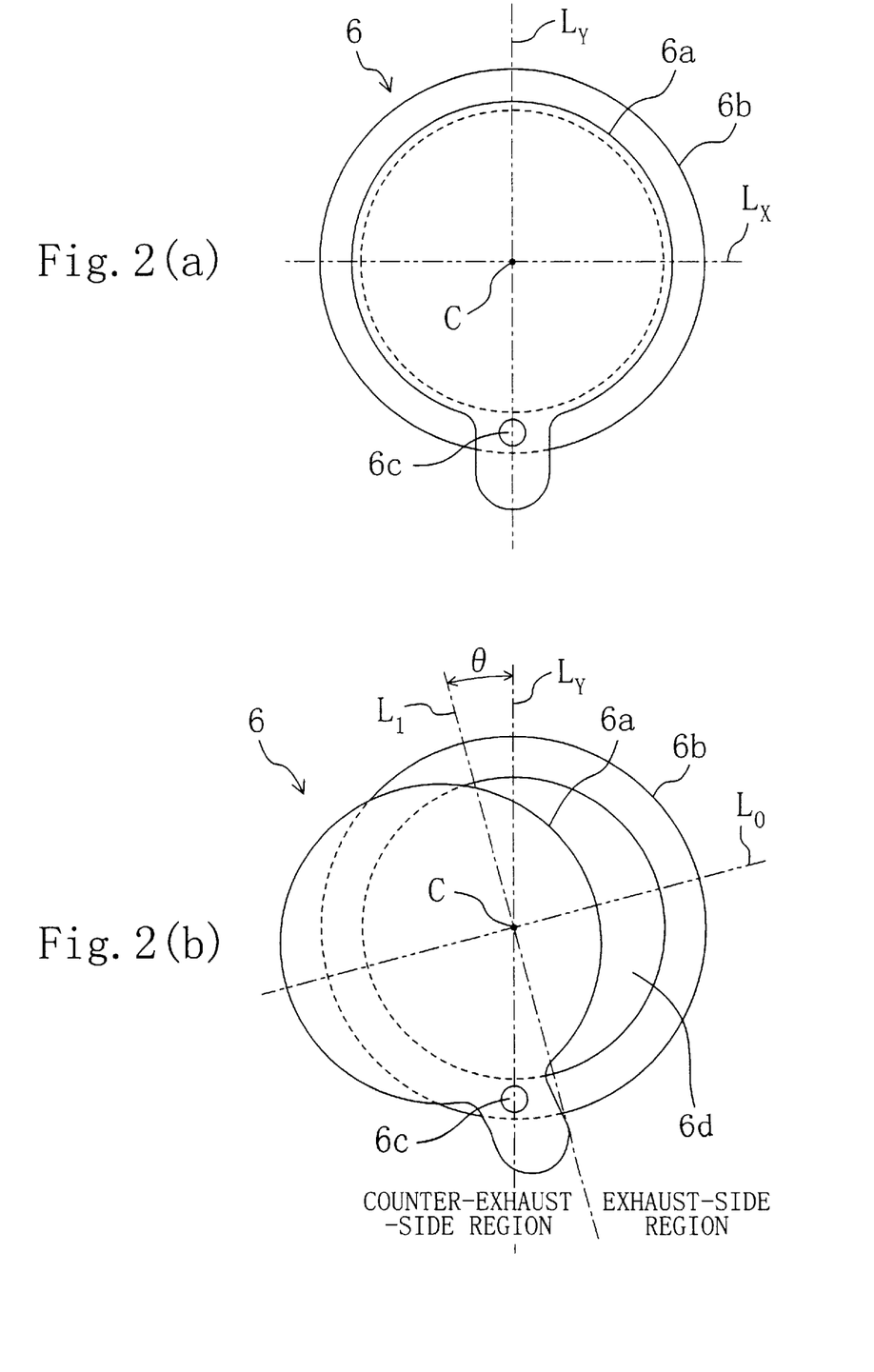
Figure 9A:
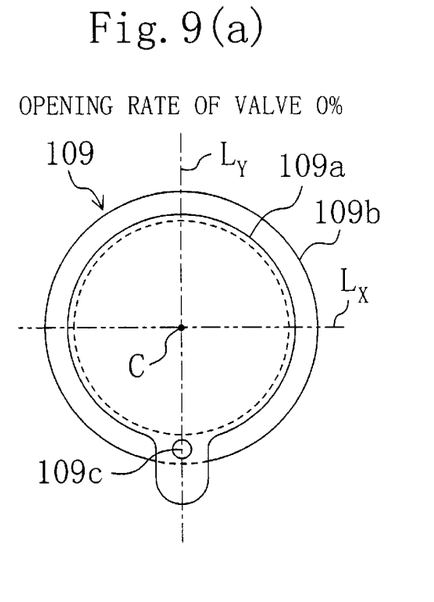
Figure 9B:
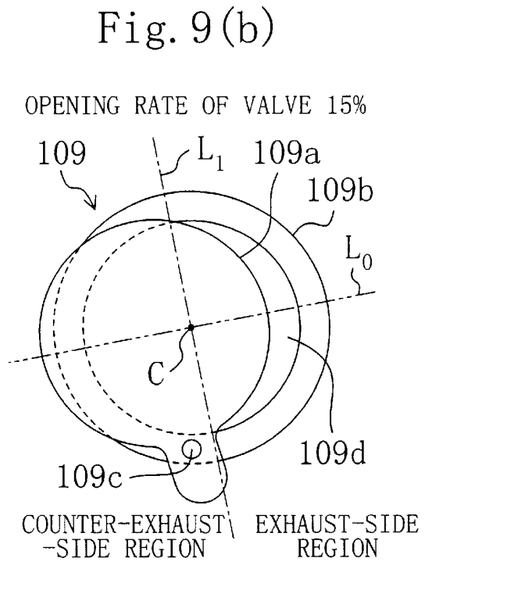
Figure 9C:
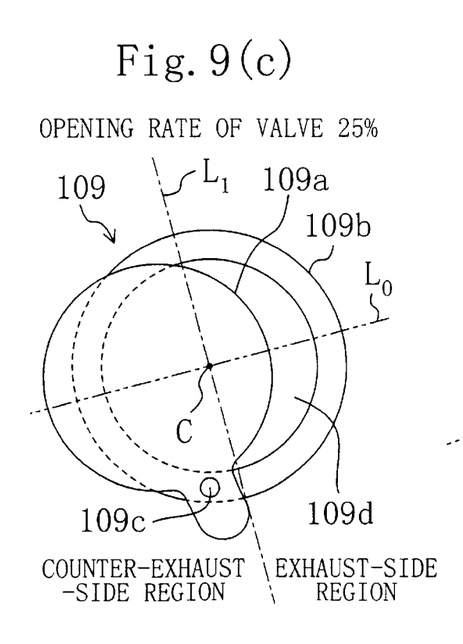
Figure 9D:
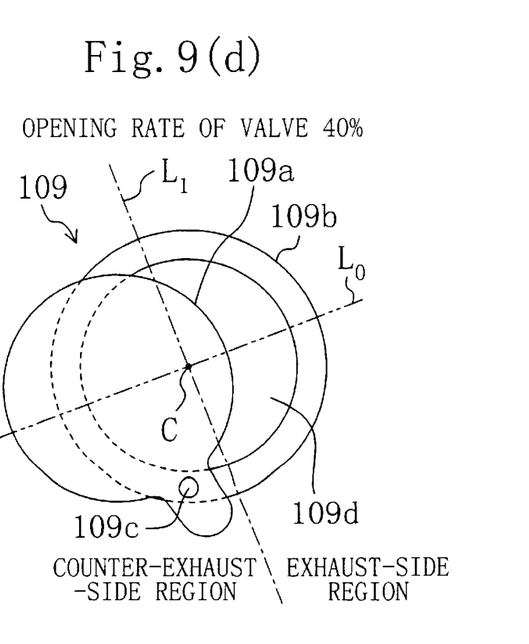

FIGS. 2(a) and 2(b) correspond to FIGS. 9(a) and 9(c), respectively. As shown in FIGS. 2(a) and 2(b), an opening 6d is formed when the valve element 6a of the slide valve 6 rotates relative to the valve seat 6b around a rotation axis 6c. A first line $L_1$ is vertical to a linearly symmetric line $L_0$ which divides the opening 6d linearly symmetrically. If the opening rate of the slide valve 6 is gradually increased by rotating the valve element 6a relative to the valve seat 6b, the first line $L_1$ dividing the slide valve 6 into the exhaust-side region and the counter-exhaust-side region comes to have a tilt angle θ with respect to a second reference line $L_Y$ extending vertically.

Figure 3:
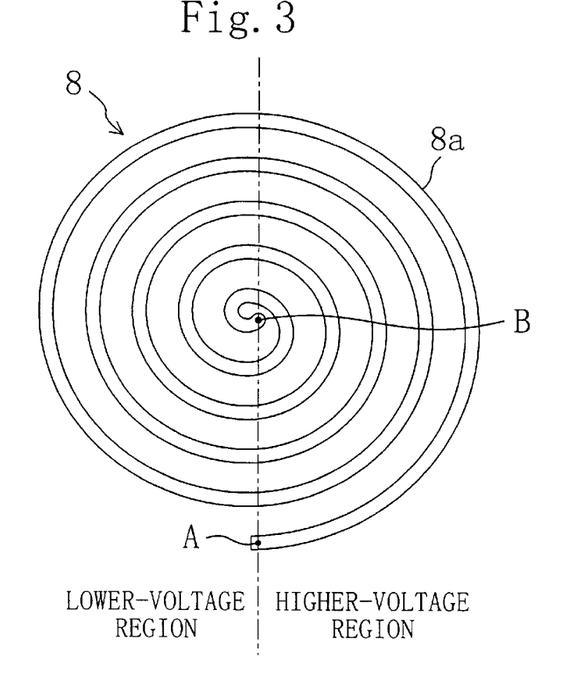
FIG. 3 is a view for illustrating the higher-voltage region and lower-voltage region of a spiral coil in the apparatus and method for plasma etching according to the embodiment.

Although FIG. 3 corresponds to FIG. 1(a), the matching circuit 9, the high-frequency power supply source 10, the rotation shaft 11, the drive shaft 12, and the rotative driving means 13 are not depicted in FIG. 3 for convenience in drawing. The coil portion 8a of the single spiral coil 8 is divided into a higher-voltage region (where a high-frequency voltage is relatively high) and a lower-voltage region (where a high-frequency voltage is relatively low) by the second line $L_2$ providing a connection between the power-supply connection point A and the ground connection point B. In this case, the position of the coil portion 8a of the single spiral coil 8 is determined such that the exhaust-side region of the slide valve 6 coincides with the higher-voltage region of the single spiral coil 8 and that the counter-exhaust-side region of the slide valve 6 coincides with the lower-voltage region of the single spiral coil 8.

As stated previously, the first line $L_1$ comes to have a tilt angle θ relative to the second reference line $L_Y$ if the opening rate of the slide valve 6 is gradually increased by rotating the valve element 6a relative to the valve seat 6b, so that the exhaust-side region of the slide valve 6 no more coincides with the higher-voltage region of the single spiral coil 8. To cause the higher-voltage region of the single spiral coil 8 to coincide with the exhaust-side region of the slide valve 6, the drive shaft 12 is rotatively driven by a specified amount by the rotative driving means 13 to rotate the second line $L_2$ by the angle θ in the direction of rotation of the first line $L_1$, thereby attaining the object. In the arrangement, the lower-voltage region of the single spiral coil 8 coincides with the counter-exhaust-side region of the slide valve 6, so that the quantity of reactive radicals distributed over the plasma generation region of the chamber 1 becomes uniform and therefore the etching rate over the surface of the target film becomes uniform.

If the higher-voltage region of the single spiral coil 8 is caused to coincide with the exhaust-side region of the slide valve 6 and the lower-voltage region of the single spiral coil 8 is caused to coincide with the counter-exhaust-side region of the slide valve 6, the quantity of reactive radicals distributed over the plasma generation region of the chamber 1 surely becomes uniform. However, if the higher-voltage region of the single spiral coil 8 approximately coincides with the exhaust-side region of the slide valve 6, the quantity of reactive radicals distributed over the plasma generation region of the chamber 1 becomes nearly uniform.

Then, the degree of displacement of the higher-voltage region of the single spiral coil 8 from the exhaust-side region of the slide valve 6 which degrades the uniformity of the etching rate over the surface of the target film was experimentally examined. The experiment was conducted by introducing etching gas composed of a mixture of $Cl_2$ gas at a flow rate of 50 sccm and $O_2$ gas at a flow rate of 2 sccm into the chamber 1, applying high-frequency power of 100 W to the single spiral coil 8, applying high-frequency power of 100 W to the sample stage 2, and thereby performing etching with respect to the ARC 111 formed on the semiconductor substrate 110.

Figure 4:
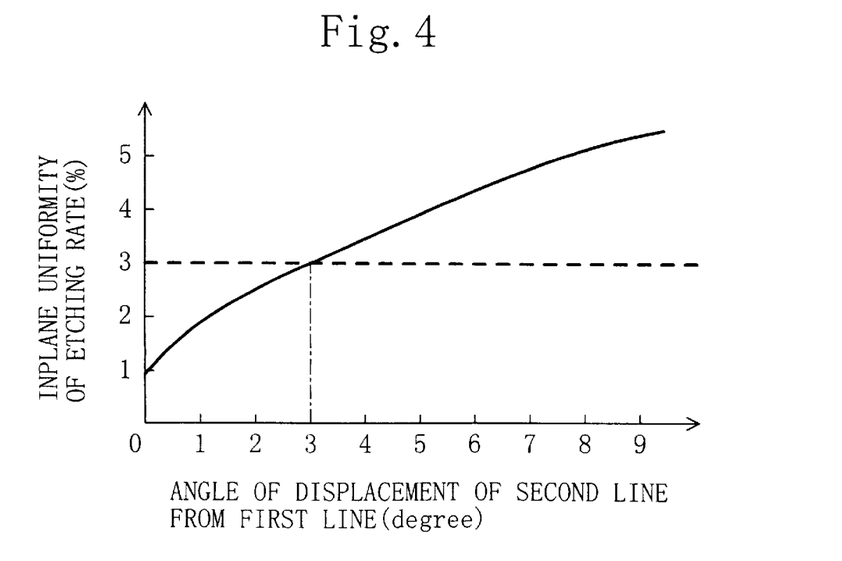
FIG. 4 is a view showing the relationship between an angle of displacement of a second line from a first line and the uniformity of an etching rate in the apparatus and method for plasma etching according to the embodiment.

FIG. 4 shows the relationship between the angle of displacement of the second line $L_2$ from the first line $L_1$ and the uniformity of the etching rate when the foregoing experiment was conducted with the opening rate of the slide valve 6 set to 30%. Since adverse effects such as variations in the characteristics of a semiconductor element were observed when the uniformity of the etching rate exceeds 3%, the uniformity of the etching rate is preferably 3% or less. If an acceptable range within which the uniformity of the etching rate is 3% or less is determined from FIG. 4, the acceptable range of the angle of displacement of the second line $L_2$ from the first line $L_1$ is 3 degrees or less. Accordingly, it can be said that the uniformity of the etching rate is within the acceptable range as long as the higher-voltage region of the single spiral coil 8 approximately coincides with the exhaust-side region of the slide valve 6 to a degree that the angle between the first and second lines $L_1$ and $L_2$ is 3 degrees or less.

A description will be given to examples of the method for plasma etching performed with respect to the ARC 111 shown in FIG. 6 by using the apparatus for plasma etching according to the present embodiment.

EXAMPLE 1

Plasma etching was performed with respect to an ARC 111 shown in FIG. 6 under the etching conditions shown in Table 1 by setting the opening rate of the slide valve 6 to 25%. In this case, the coil portion 8a of the spiral coil 8 was rotated by rotatively driving the drive shaft 12 such that the higher-voltage region of the single spiral coil 8 approximately coincides with the exhaust-side region of the slide valve 6, i.e., the second line $L_2$ coincides with the first line $L_1$.

The resulting inplane uniformity of the etching rate was 2.5%, which reprsents an improvement over the inplane uniformity (about 3.4% in FIG. 8) when the coil portion 8a of the spiral coil 8 was not rotated.

EXAMPLE 2

Plasma etching was performed with respect to the ARC 111 shown in FIG. 6 under the etching conditions shown in Table 2 by setting the opening rate of the slide valve 6 to 40%. In this case, the coil portion 8a of the spiral coil 8 was rotated by rotatively driving the drive shaft 12 such that the higher-voltage region of the single spiral coil 8 approximately coincides with the exhaust-side region of the slide valve 6, i.e., the second line $L_2$ coincides with the first line $L_1$.

The resulting inplane uniformity of the etching rate was 2.8%, which represents an improvement over the inplane uniformity (about 5.5% in FIG. 8) when the coil portion 8a of the spiral coil 8 was not rotated.

Instead of the ARC, the target film may be a silicon-based film such as a polysilicon film, a silicon oxide film, a silicon nitride film, a metal film, or a ferroelectric film. If the material of the target film changes, it is necessary to change the etching conditions including the gas flow rate. However, the inplane uniformity of the etching rate is held excellent if the coil portion 8a of the spiral coil 8 is rotated in response to a change in the opening rate of the slide valve 6 such that the higher-voltage region of the single spiral coil 8 approximately coincides with the exhaust-side region of the slide valve 6.

What is claimed is:

1. A method for plasma etching, comprising:

a plasma generating step of changing etching gas introduced into a chamber into a plasma with a high-frequency induction field generated by a spiral coil rotatably disposed in opposing relation to a sample stage within said chamber;

an etching step of guiding said etching gas that has been changed into the plasma toward a target film to be etched on a substrate held by said sample stage to etch said target film; and a gas exhaust step of exhausting the gas from said chamber through a bottom portion of said chamber, while adjusting an amount of exhaust by rotating a valve element of a slide valve relative to a valve seat, said etching step including the step of rotating said spiral coil in response to the rotation of the valve element of said slide valve such that a higher-voltage region of said spiral coil coincides with an exhaust-side region of said slide valve.

2. The method for plasma etching according to claim 1, wherein said target film to be etched is an organic film.

* * * * *